United States Patent
Wang et al.

(10) Patent No.: US 9,576,649 B2
(45) Date of Patent: Feb. 21, 2017

(54) CHARGE LOSS COMPENSATION THROUGH AUGMENTATION OF ACCUMULATED CHARGE IN A MEMORY CELL

(71) Applicant: Seagate Technology LLC, Cupertino, CA (US)

(72) Inventors: Wei Wang, San Diego, CA (US); Antoine Khoueir, Apple Valley, MN (US); Young Pil Kim, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/675,056

(22) Filed: Mar. 31, 2015

(65) Prior Publication Data

US 2016/0293250 A1   Oct. 6, 2016

(51) Int. Cl.
| | | |
|---|---|---|
| *G11C 13/00* | (2006.01) | |
| *G11C 16/14* | (2006.01) | |
| *G11C 11/56* | (2006.01) | |
| *G11C 16/34* | (2006.01) | |

(52) U.S. Cl.
CPC ....... *G11C 13/0033* (2013.01); *G11C 11/5642* (2013.01); *G11C 16/14* (2013.01); *G11C 16/3431* (2013.01)

(58) Field of Classification Search
CPC ............. G11C 11/5635; G11C 11/5642; G11C 13/0033
See application file for complete search history.

(56) References Cited

U.S. PATENT DOCUMENTS

| | | |
|---|---|---|
| 6,343,033 B1 | 1/2002 | Parker |
| 6,424,569 B1 | 7/2002 | Parker et al. |
| 6,751,146 B1 | 6/2004 | Wang et al. |
| 7,184,307 B2 | 2/2007 | Lee |
| 7,325,090 B2 | 1/2008 | Ronen |
| 7,710,777 B1 | 5/2010 | Montierth et al. |
| 8,261,136 B2 | 9/2012 | D'Abreu et al. |
| 8,593,884 B2 | 11/2013 | Park et al. |
| 8,938,655 B2 | 1/2015 | Hamilton et al. |
| 2009/0161466 A1 | 6/2009 | Hamilton et al. |
| 2010/0020604 A1* | 1/2010 | Cornwell ............ G11C 11/5642 365/185.03 |
| 2010/0318733 A1 | 12/2010 | Seo et al. |
| 2012/0271982 A1 | 10/2012 | Callaghan |
| 2014/0003155 A1* | 1/2014 | Hong ..................... G11C 16/10 365/185.22 |

(Continued)

FOREIGN PATENT DOCUMENTS

WO    2009/042298 A1    4/2009

*Primary Examiner* — Han Yang
*Assistant Examiner* — Jerome Leboeuf
(74) *Attorney, Agent, or Firm* — Hall Estill Attorneys at Law

(57) ABSTRACT

Method and apparatus for managing data in a memory, such as a flash memory array. In accordance with some embodiments, a block of solid-state non-volatile memory cells are each programmed to an associated programmed state responsive to a respective amount of accumulated charge. A charge loss compensation circuit adds a relatively small amount of additional charge to the respective amount of accumulated charge in each of the memory cells to maintain the associated programmed states of the cells.

18 Claims, 5 Drawing Sheets

(56) References Cited

U.S. PATENT DOCUMENTS

| | | |
|---|---|---|
| 2014/0059405 A1 | 2/2014 | Syu et al. |
| 2014/0101371 A1 | 4/2014 | Nguyen et al. |
| 2014/0201437 A1 | 7/2014 | Endres |
| 2015/0023097 A1* | 1/2015 | Khoueir .................. G11C 16/10 365/185.03 |

* cited by examiner

BLOCKS WITH 4K PE CYCLES

CHARGE LOSS COMPENSATION THROUGH AUGMENTATION OF ACCUMULATED CHARGE IN A MEMORY CELL

SUMMARY

Various embodiments disclosed herein are generally directed to the management of data in a memory, such as but not limited to a flash memory array.

In accordance with some embodiments, a block of solid-state non-volatile memory cells are each programmed to an associated programmed state responsive to a respective amount of accumulated charge. A charge loss compensation circuit adds a relatively small amount of additional charge to the respective amount of accumulated charge in each of the memory cells to maintain the associated programmed states of the cells.

In accordance with further embodiments, a data storage device has an array of flash memory cells and a programming circuit adapted to program each of the flash memory cells to one of a plurality of available programming states responsive to a transfer of different corresponding amounts of charge to the flash memory cells. The transferred charge is accumulated on floating gates of the flash memory cells. A charge loss compensation circuit is adapted to, for a group of the flash memory cells, perform a charge augmentation operation by adding a relatively small amount of additional charge to the respective amount of accumulated charge in each of the flash memory cells in the group to maintain the associated programmed states of the flash memory cells in the group without performing a read operation to read the respective programmed states and without performing an intervening erasure operation to remove accumulated charge from the memory cells.

In accordance with further embodiments, a method comprises programming a block of solid-state non-volatile memory cells to respective programming states in relation to a total amount of accumulated charge in each of the memory cells; and performing a charge augmentation operation by adding a relatively small amount of additional charge to the respective amount of accumulated charge in each of the memory cells to maintain the associated programmed states of the cells.

These and other features and advantages which may characterize various embodiments can be understood in view of the following detailed discussion and the accompanying drawings.

DETAILED DESCRIPTION

Figure 1:
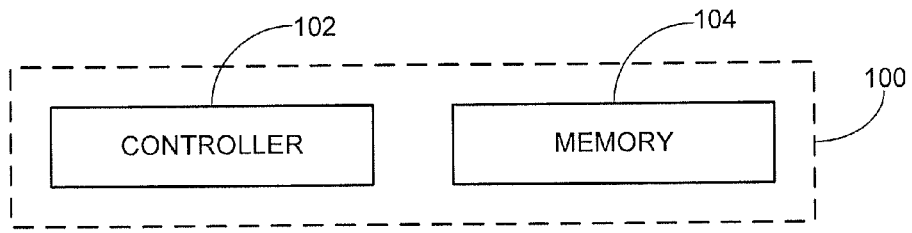
FIG. 1 provides a functional block representation of an exemplary data storage device in accordance with some embodiments.

The present disclosure generally relates to the management of data in a memory, such as but not limited to data stored in a flash memory array.

Data storage devices are provided with one or more memory devices to store and/or retrieve computerized data. Some solid-state semiconductor based memory devices, such as flash memory, utilize the transfer of charge to establish programming states in individual solid-state memory cells.

NAND flash memory stores data in the form of accumulated charge on floating gates of flash memory cells. The memory cells may be characterized as nMOSFETs (n-channel metal oxide semiconductor field effect transistors) with an isolated floating gate structure isolated from a main control gate of each transistor. The memory cells store substantially no accumulated charge on the floating gates in an erased state, and store increased amounts of accumulated charge when programmed. Programming operations cause migration of charge to the floating gates, and erasure operations migrate charge from the floating gates to reset the cells to a base (erased) state.

Flash memory cells can be configured as SLCs (single level cells) or multi-level cells (MLCs). SLCs store a single bit per cell, while MLCs store multiple bits per cell (usually 2 bits per cell). The erased state of an SLC has substantially no accumulated charge on the floating gate (or is charged with a different type of charges such as positive charges), and this state is assigned a logical value such as logical 1. Using this convention, the logical state of a programmed SLC will either be a logical 1 (e.g., still substantially no charge on the floating gate) or a logical 0 (some amount of accumulated charge above a predetermined threshold). In an MLC, the erased state is typically treated as a logical 11. Using this convention, successively greater amounts of charge on the floating gate result in programmed states of 10, 00 and 01.

In a programmed cell, the respective amounts of accumulated charge are ideally retained within some discrete quanta ranges that are separated by a sufficient distance such that read voltage thresholds applied to the cells can clearly and accurately discern the programmed state the cell.

While operable to store and retrieve data in a fast and efficient manner, programmed flash memory cells can experience changes ("charge drift") in the total amount of accumulated charge over time. A variety of environmental and operational parameters can influence the rate of charge drift in a flash memory cell. In particular, a phenomenon sometimes referred to as "charge loss" can arise when maintaining a programmed state of the memory cells for a certain time period. During this time period (retention time), the charge levels in the cells shift down as charge leaks from the floating gates.

Accordingly, various embodiments of the present disclosure are generally directed to an apparatus and method for compensating for charge loss and other effects upon the charge state of a solid-state memory cell, such as a flash memory cell.

As explained below, in some embodiments a block of erasable non-volatile memory cells are each programmed to an associated programmed state responsive to a respective amount of accumulated charge. A charge loss compensation circuit operates to add a relatively small amount of additional charge to the respective amount of accumulated charge in each of the memory cells to maintain the associated programmed states of the cells.

In some cases, the circuit monitors a parametric state associated with the respective cells and operates to augment the charge in relation to the monitored parametric state. The small amount of additional charge may be a quantum of charge associated with the programming of the lowest charged state.

For example, if logical 11 represents the erased state for a set of MLCs, each of the programmed MLCs augmented by the circuit will receive charge corresponding to a programming operation to program each of the MLCs to the logical 11 state. It will be appreciated that the augmentation operation does not alter the existing programmed states of the cells; regardless whether the MLCs are programmed to 11, 10, 00 or 01, nominally the cells will retain the previously programmed levels after receiving the programming operation to the logical 11 state.

These and other features and aspects of various embodiments will be understood beginning with a review of FIG. 1 which generally illustrates an exemplary data storage device 100. The device 100 includes a controller 102 and a memory module 104. The controller 102 provides top level control for the device 100 and may be configured as a programmable processor with associated programming in local memory.

The memory module 104 can be arranged as one or more non-volatile memory elements such as rotatable recording discs or solid-state memory arrays. While a separate controller 102 is shown in FIG. 1, such is unnecessary as alternative embodiments may incorporate any requisite controller functions directly into the memory module. While not limiting, for purposes of the present discussion it will be contemplated that the data storage device 100 is a solid-state drive (SSD) that utilizes flash memory cells in the memory module 104 to provide a main data store for a host device (not shown).

The host device can be any device that communicates with the storage device 100. For example and not by way of limitation, the storage device may be physically incorporated into the host device, or the host device may communicate with the host device via a network using any suitable protocol.

Figure 2:
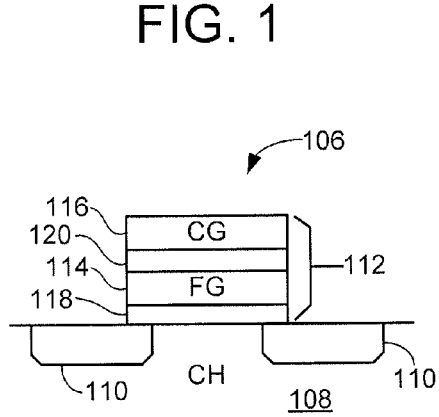
FIG. 2 shows a flash memory cell construction that can be used in the device of FIG. 1.

FIG. 2 illustrates an exemplary flash memory cell 106 that can be incorporated into the memory module 104 of FIG. 1. The memory cell 106 as shown in FIG. 2 is formed on a semiconductor substrate 108 having spaced apart n+ doped regions 110. A gate structure 112 spans the pair of adjacent doped regions so that the flash cell 106 takes a general nMOS transistor configuration. A series of adjacent flash cells can be formed in a NAND configuration with a gate structure 112 spanning each adjacent pair of doped regions 110.

Each gate structure 112 provides an alternating stack of electrically conductive gates 114, 116 and electrically insulative regions 118, 120. The gate 114 is referred to as a floating gate (FG) and the gate 116 is referred to as a control gate (CG) 116.

Data are stored by each cell 106 in relation to the relative amount of accumulated electrical charge stored on the floating gate 114. The floating gate 114 accumulates charge during a programming operation by the selected application of appropriate voltages to the adjacent doped (drain and source) regions 110 and the control gate 116. This induces a controlled migration of electrical charge from a channel (CH) portion of the semiconductor substrate 108 across the insulative region 118 to the floating gate 114.

Accumulated charge is subsequently removed from the floating gate 114 using an erasure operation. During erasure, appropriate voltages are applied to the regions 110 and the control gate 116 to induce migration of the accumulated charge from the floating gate 114, across the insulative region 118 to the channel CH.

In an initial erased state, there will be substantially no accumulated charge on the FG 114. In this state, the cell will exhibit drain-source conductivity across the channel CH without the application of significant voltage to the control gate 116. Once charge has been accumulated on the FG 114, however, the drain-source path will remain non-conductive unless a sufficiently high gate control voltage is applied to the control gate 116, at which point the cell becomes conductive.

The programmed state of the cell 110 can be determined by observing the level of control gate voltage required to allow drain-source current to pass through the cell, which indicates the amount of accumulated charge on the floating gate 114. Different, discrete amounts of total accumulated charge can therefore be used to denote different programmed states.

The cells 106 can be configured as single-level cells (SLCs) or multi-level cell (MLCs). An SLC flash cell stores a single bit; a normal convention is to assign the logical bit value of 1 to an erased cell (substantially no accumulated charge) and a logical bit value of 0 to a programmed cell (presence of accumulated charge above a predefined level).

An MLC flash memory cell stores multiple bits, such as two bits. Generally, n bits can be stored using $2^n$ storage states. A normal convention is to assign the multi-bit logical value 11 to an erased cell with charge C0 (substantially no accumulated charge), and assign other multi-bit logical values (e.g., 10, 00 and 01) to increasingly higher charge levels C1, C2 and C3 where $C0<C1<C2<C3$.

Figure 3:
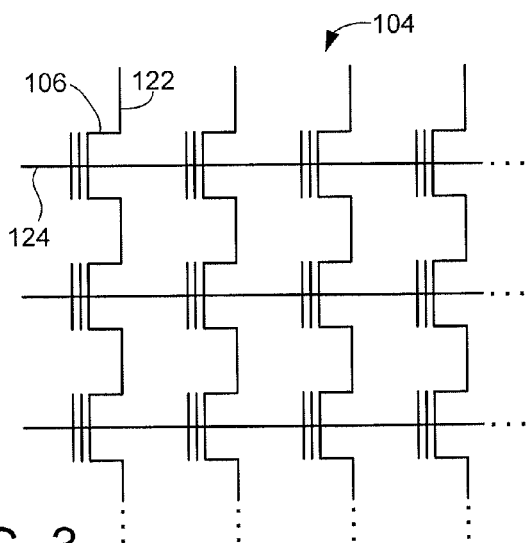
FIG. 3 is a schematic depiction of a portion of a flash memory array using the cells of FIG. 2.

The memory cells 106 can be arranged in the memory module 104 as an array of rows and columns, as generally depicted in FIG. 3. Each column of cells can be coupled via one or more bit lines (BL) 122. The control gates (CG) 116 of the cells 106 along each row can be interconnected via individual word lines (WL) 124. Various control circuits can be used to individually access the cells.

Figure 4:
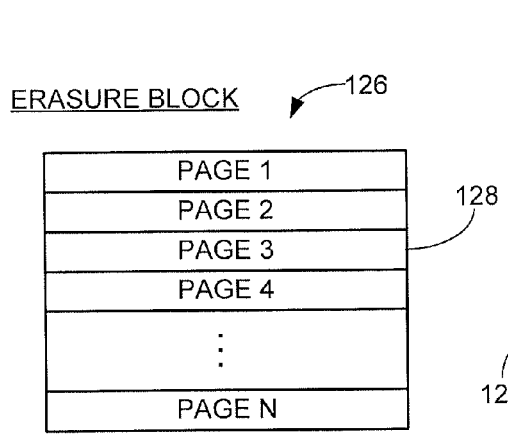
FIG. 4 illustrates a format for an erasure block.

The array of memory cells 106 shown in FIG. 3 may further be grouped into erasure blocks 126, as depicted in FIG. 4. Each erasure block 126 is a separately addressable block of memory and represents the smallest unit of memory that can be concurrent erased at a time. Each row of cells (see FIG. 2) is configured to store a fixed-sized block, or page 128 of data. In some cases, multiple pages of data may be stored to the same row of MLCs, with the most significant bit (MSB) of the programmed state indicating the data state of a first page of data and the least significant bit (LSB) of the programmed state indicating the data state of a second page of data.

Block-level wear leveling may be employed by the controller 102 to track the erase and write status of the various blocks 126. New blocks can be allocated for use as required to accommodate newly received data. Metadata and other control information to track the data may be stored in each erasure block 126, or stored elsewhere such as in specific blocks dedicated to this purpose.

Once data are written to a particular group of cells, it is usually required to erase those cells before new data may be written thereto. Data for a particular logical address (e.g., logical block address, or LBA) may be stored in a first page with a first physical address. Should the device 100 receive a write command to write new, updated data for that LBA, the controller 102 may select a second, new page with a different physical address to store the updated data, and may mark the LBA data in the first page as stale (older version) data. When all of the data in a page are superseded, the page may be marked for erasure. When enough pages in a given block are marked for erasure, a garbage collection (GC) operation may be scheduled in the background to migrate current version data to a new block and to erase the existing block.

Figure 5:
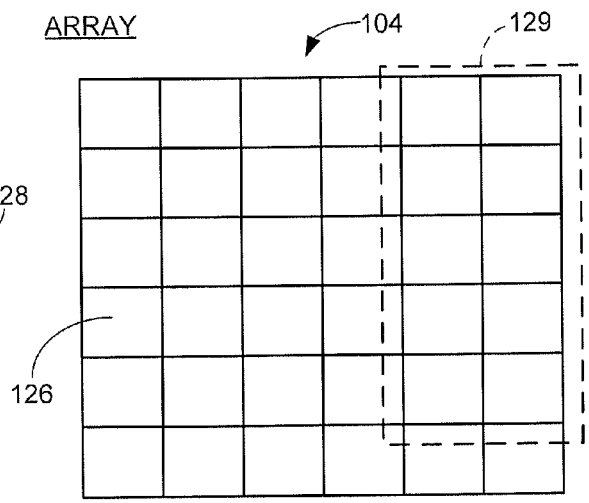
FIG. 5 is an exemplary arrangement of erasure blocks from FIG. 4.

FIG. 5 shows a portion of the memory array 104 as a grouping of erasure blocks 126 from FIG. 4. It is contemplated that the memory array 104 may include any number of such blocks, including blocks on different dies, strips, planes, chips, layers and arrays. Each of the erasure blocks 126 may be separately erasable and the controller 102 may track control information for each erasure block, such as a total number of erasures, date stamp information relating to when the various blocks have been allocated, etc. The controller may group multiple sets of the erasure blocks into larger, multi-block garbage collection units (GCUs) which are allocated and erased as a unit. An exemplary GCU is represented at 129.

Figure 6:
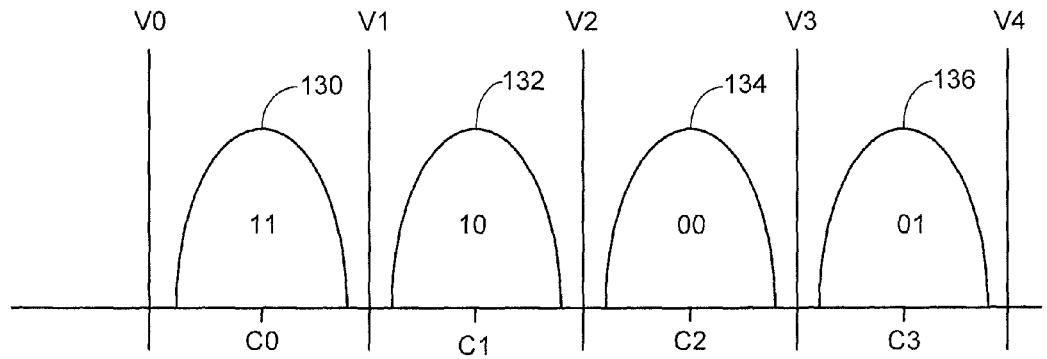
FIG. 6 shows charge distributions indicative of different data storage states for the flash memory cells in a flash memory array.

FIG. 6 shows a sequence of charge distributions 130, 132, 134 and 136. These distributions represent different groupings of memory cells 116 from FIGS. 3-5 that were stored with different charge levels during normal programming operations. Distribution 130 represents a first population of cells programmed to a first nominal charge level C0 (logical 11) state. Distribution 132 represents a second population of cells programmed to a second nominal charge level C1 (logical 10); distribution 134 represents a third population of cells programmed to a third nominal charge level C2 (logical 00); and distribution 136 represents a fourth population of cells programmed to a fourth nominal charge level C3 (logical 01). Other logical designations can be assigned to these distributions.

The populations are shown to be substantially Gaussian about the nominal charge levels C0<C1<C2<C3. The variations in charge level arise as a result of a variety of operational factors. For example, during programming a charge pump may be used to transfer discrete quanta of charge to the cells, and this process may result in slightly different total amounts of accumulated charge on individual cells programmed to the same state. Other contributing factors can include aging, manufacturing variations, temperature, etc.

Normally, the distributions are sufficiently distinct such that intervening read sense voltages can be applied to differentiate between the respective distributions and identify the programmed state of a given cell. Four such read sense voltages are depicted in FIG. 6 as V1 through V4 with V1<V2<V3<V4. By way of illustration, the application of read sense voltage V3 to the control gates of the various flash cells in FIG. 3 (via word lines 124) would tend to be sufficient to place those cells in the right-most distribution 136 into a conductive state, whereas the cells in the remaining distributions 130-134 would remain in a non-conductive state. The programmed state of any given cell can thus be quickly sensed by the application of one or more of the sense voltages V1-V3 in a selected order.

Figure 7:
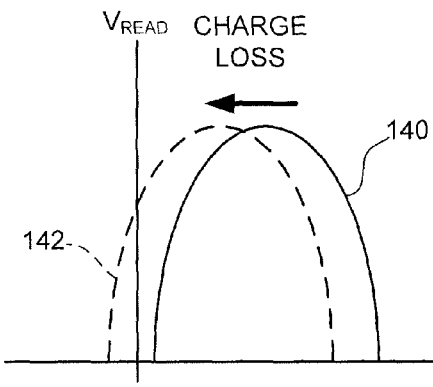
FIG. 7 illustrates exemplary changes in charge distribution that may arise through the loss of accumulated charge in a flash memory array.

FIG. 7 shows another charge distribution 140 to illustrate the shifting of charge as a result of charge loss effects. In some cases, repeated program, erase and/or read cycles of the cells in the distribution 140 may result in accumulated damage to the memory cells over time, resulting in accelerated charge losses as indicated by shifted distribution 142.

A portion of the shifted distribution 142 in FIG. 7 crosses a baseline read voltage threshold $V_{READ}$, meaning that the programmed state of those cells to the left of the threshold will be incorrectly detected during a read operation.

This shifting of the population distribution to the left generally signifies a low scale loss of charge on the various floating gates of the memory cells as the respective read thresholds are applied to the associated control gates. Each of the distributions in FIG. 6 may be subject to charge leakage under various operational and environmental conditions. While the shifted distribution 142 is shown to nominally have the same shape as distribution 140, it will be appreciated that other distribution shapes may arise as charge leaks from the respective cells.

Figure 8:
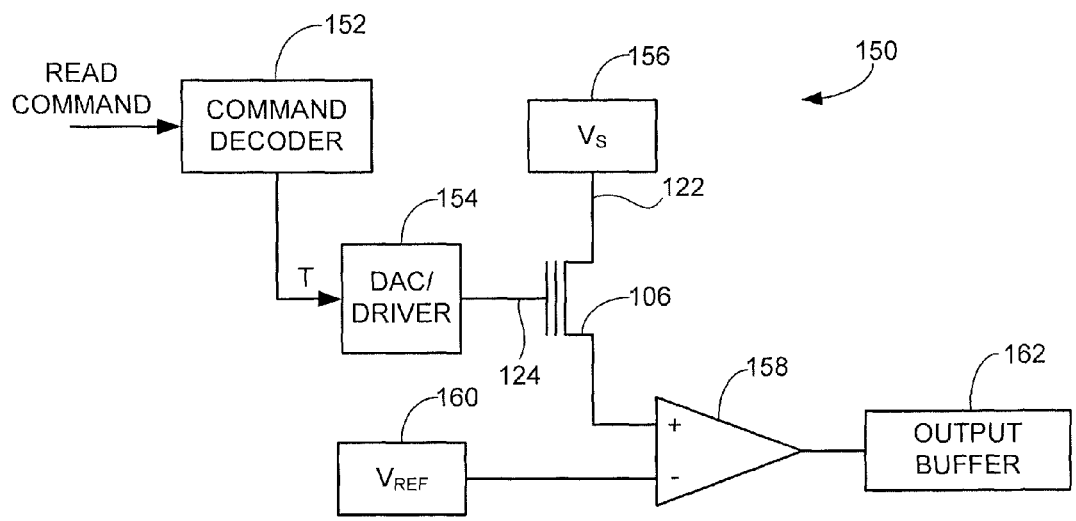
FIG. 8 depicts a read circuit adapted to read the storage states of FIG. 6 in accordance with some embodiments.

Before discussing the manner in which various embodiments of the present disclosure operate to compensate for such charge loss effects as represented in FIG. 6, it will be helpful to briefly discuss the manner in which data may be read from and programmed to the memory array. FIG. 8 is a functional block representation of a read circuit 150 of the storage device 100 in accordance with some embodiments. The read circuitry is adapted to apply the read voltage thresholds of FIGS. 6-7 during a read operation to detect the programmed states of respective memory cells 106.

A command decoder 152 decodes an input read command and outputs an appropriate read threshold value T to a digital-to-analog (DAC) driver circuit 154. The threshold value T is a multi-bit digital representation of a selected analog voltage value such as from FIG. 6 (e.g., voltage V1, V2, V3 or V4). The DAC/driver 154 applies the corresponding analog voltage to the gate structure of the selected cell 106 via the associated word line 124 (see FIG. 3).

A voltage source 156 applies a suitable source voltage $V_S$ to the bit line 122 coupled to the memory cell 106 being read. A sense amplifier 158 determines whether the applied voltage is sufficient to place the cell 106 into a conductive state through a comparison with a reference voltage $V_{REF}$ from a reference voltage source 160. A resulting bit value is output to an output buffer 162 (e.g., a 0 or 1) responsive to the comparison.

Figure 9:
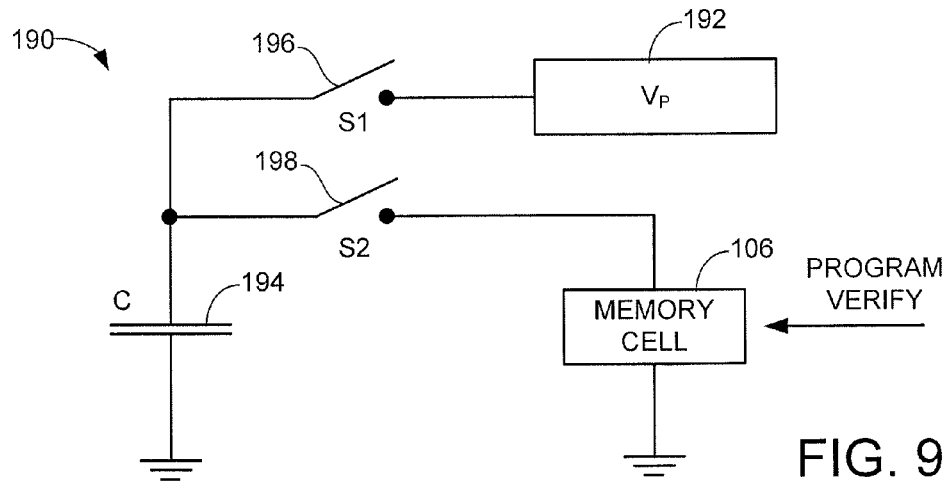
FIG. 9 illustrates a programming circuit adapted to write the storage states of FIG. 6 as well as carry out charge augmentation operations in accordance with some embodiments.

FIG. 9 is a functional block representation of a data programming circuit 190 of the data storage device 100. The circuit 190 is configured to transfer charge to the floating gates of the various memory cells 106 during programming operations.

The circuit 190 takes a general charge pump configuration with a programming voltage source 192 that supplies a suitable programming voltage $V_P$, a capacitor (C) 194 or other charge storage device, and a pair of switches 196, 198 denoted as switches S1 and S2. The switches can take any suitable form such as power MOSFETs.

The circuit operates to transfer discrete quanta of charge to the floating gate. To this end, one or more charge-transfer cycles are applied to the memory cell. During a charge cycle, switch S1 is closed, switch S2 is opened, and charge accumulates as the voltage $V_p$ is applied to the capacitor C. During a transfer cycle, switch S1 is opened and switch S2 is closed, enabling a transfer of the charge accumulated by the capacitor C to the memory cell 106.

The foregoing sequence is repeated as required until the total amount of accumulated charge on the floating gate of the memory cell 106 reaches a desired level indicative of the programming of the cell to the desired programmed state. A program verify operation is periodically carried out to assess the then-existing program state of the cell, using the read circuit 150 of FIG. 8. A suitable program verify threshold is used, which may be different from the various read thresholds depicted in FIGS. 6-7.

In some cases, a program verify operation is carried out after each charge transfer. In other cases, a selected number of charge transfers are applied before the program verify operations are applied.

Figure 10:
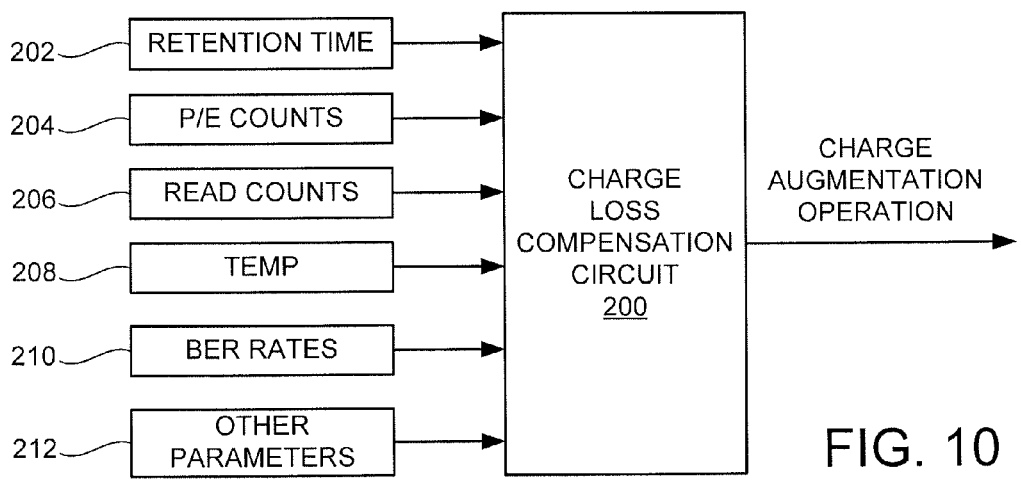
FIG. 10 is a functional block representation of a charge loss compensation circuit constructed and operated in accordance with some embodiments.

FIG. 10 shows a charge loss compensation circuit 200 that incorporates and/or operates in conjunction with the read and program circuits 150, 190 to compensate for charge loss effects upon the memory cells. Generally, the compensation circuit 200 evaluates various parametric states of the memory cells 106 and, in response thereto, carries out a charge augmentation operation on those cells exhibiting possible charge loss effects. The circuit 200 can be realized in hardware, firmware and/or software. In some cases, the circuit 200 includes programming utilized by the top level controller 102 (see FIG. 1).

The circuit 200 accesses various parameters stored in a suitable memory location in making the charge augmentation determination. Exemplary parameters represented in FIG. 10 include retention time 202, which relates to the overall elapsed time that a given set of data (e.g., a page of data) have been retained in a given physical location within the memory array.

Program/Erase (P/E) counts 204 relate to the total number of programming and erasure operations that have been applied to a given page, block or GCU that contains the physical location. Such statistics may be accumulated as part of the metadata management operation of the device and are updated during the ongoing operation of the device 100. For reference, SLCs may have a rated life of nominally 100,000 (100K) P/E cycles before wearing out, while MLCs may have a significantly reduced rated life such as 5K or 10K P/E cycles.

Read counts 206 indicate the number of read operations that have been carried out to the memory cells in the selected location. This can include reads mad directly to the memory cells, and/or reads made to adjacent cells. Temperature (temp) 208 indicates the measured temperature of the memory, such as at the time of programming, at the current time, maximum measured time during which the data have remained programmed in the memory, etc.

Bit error rates (BER) 210 indicate the number of bit errors experienced during readback of data from the selected physical location. Typical BERs are expressed as number of bit errors per total number of bits read, and may be on the order of $10^{-6}$ to $10^{-7}$ for some types of flash memory arrays. Various other parameters 212 may be measured and used by the circuit 200 as well. Generally, any environmental or operational parameter found to have an effect on charge leakage can be collected and assessed as desired.

Figure 11:
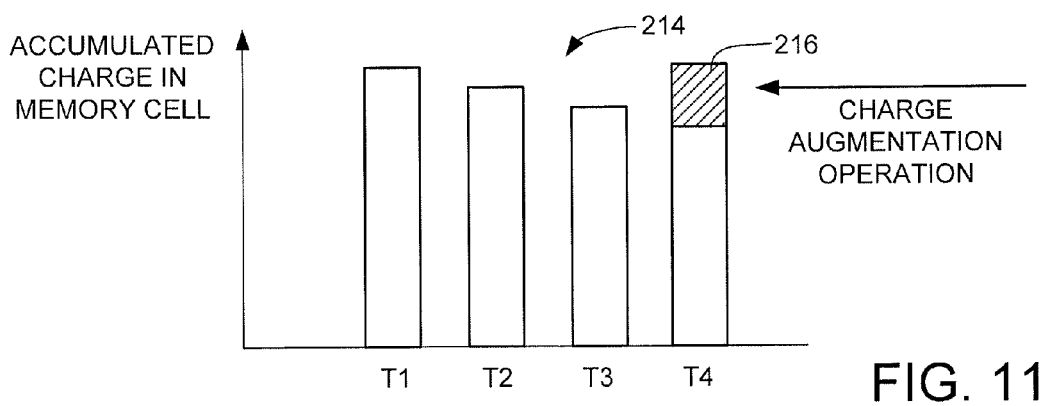
FIG. 11 is a graphical representation of exemplary operation of the circuit of FIG. 10.

FIG. 11 shows exemplary operation of the circuit 200 of FIG. 10 for a selected memory cell 106. Open bars 214 represent a total amount of accumulated charge on the floating gate of the memory cell, which is initialized using a programming operation at time T1. Over time, the initial amount of accumulated charge decays, as represented by the corresponding bars at times T2 and T3. The rate of decay may be linear, exponential, geometric, etc. and may be significantly influenced by the parametric factors discussed above in FIG. 10. It is contemplated that such decay takes place over a relatively long period of time, such as over a period of hours, days, weeks, etc.

A charge augmentation operation by the circuit 200 at time T4 results in the addition of a small amount of additional charge to the cell, as represented by augmented bar 216. This brings the total amount of charge accumulated on the memory cell nominally back to the same level as at time T1. It will be appreciated that, in practice, the actual amount of charge and the amount of decay can vary, so that the final total amount of accumulated charge at time T4 may be less than, equal to or greater than, the initial amount of total accumulated charge at time T1.

Figure 12:
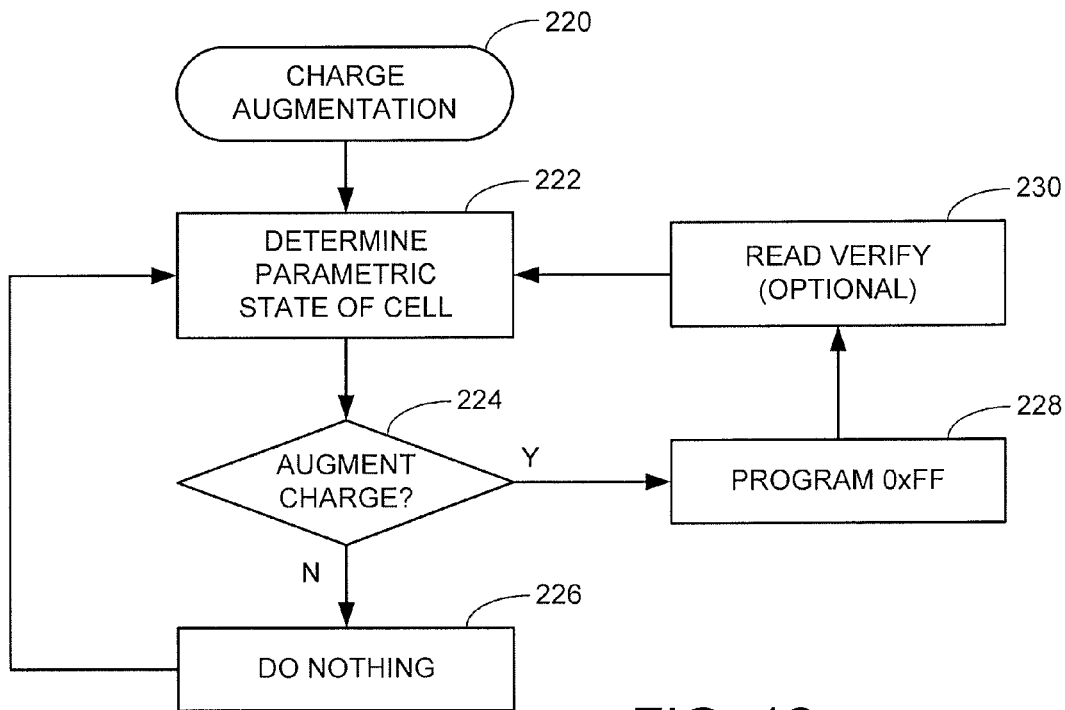
FIG. 12 is a flow chart for a CHARGE AUGMENTATION routine generally illustrative of steps carried out by the circuit of FIG. 10 in accordance with some embodiments.

FIG. 12 is a flow chart for a charge augmentation routine 220 illustrative of steps carried out by the circuit 200 of FIG. 10. The routine will be described in terms of assessing a single cell, but it will be understood that the processing can be applied to groups of cells (e.g., one or more pages of memory, an erasure block, a GCU, the entire array, etc.).

At suitable times during operation, the circuit 200 operates to determine the parametric state of the cell, step 222. This may be carried out using the various parametric data represented in FIG. 10. Decision step 224 determines whether a charge augmentation operation should be carried out; if not, no further processing takes place as indicated at step 226 and the flow returns to step 222.

At such time that a decision is made to perform a charge augmentation operation, the flow passes to step 228 where a programming operation (e.g., program 0xFF) is applied to the selected cell(s). The programming operation corresponds to the lowest level of charge to those cells. With reference back to FIG. 6, the convention of the present discussion identifies the lowest charge state as corresponding to programmed state 11.

Accordingly, step 228 applies a programming operation to program each of the cells under evaluation to programming state 11. The programming operation does not overwrite the existing data; instead, the operation adds a small amount of additional charge to each of the existing charge state to boost the existing state, as discussed above in FIG. 11.

The process applies a programming operation for the 11 programming state by using a charge pump or similar mechanism to add small discrete quanta of charge to the floating gate of the cell. With reference back to FIG. 9, this may involve performing one or more charge-transfer cycles using the circuit 190 to pass one or more quanta of charge to the memory cell.

After one or more transfer cycles, an appropriate program verify voltage may be applied to the memory cell. The program verify voltage may correspond to a voltage used to sense the state 11, such as the voltage V0 in FIG. 6. A different verify voltage level may be used. It will be noted that regardless of the programmed state (e.g., 11, 10, 00, 01), the applied program verify voltage will normally be sufficient to place all of the cells in a forward conductive state. Hence, the charge augmentation step transfers one or more small quanta of charge, applies the program verify to ensure the cell is conductive, and then moves on to the next cell.

The processing is somewhat analogous to a waiter topping off a mostly full glass of water with a little bit more water to bring the level back to the top.

As desired, an optional read verify operation can next be performed on a group of cells, as indicated by step 220. The read verify operation ensures that all of the resulting states of the cells are recoverable, and can be performed using existing error correction code (ECC) or other parity information. In another embodiment, the existing data can be read from the memory (including the application of ECC to detect and correct bit errors), the charge augmentation operation can be applied to the cells, and then the augmented data states can be read from the memory, corrected, and compared to the existing data states prior to the augmentation operation. Should errors be detected resulting from the application of too much additional charge, a separate step of rewriting the data to a new location (or to the same location after an erasure or garbage collection operation) can be performed as required.

In some cases, the scheduling of the augmentation operations can be based on retention time (period) for the data. Data having been retained for a relatively short period of time may be deemed safe and therefore no augmentation processing is required. Once a particular retention period threshold has been reached, however, the cells may be subjected to the charge augmentation processing. Alternatively, other parameters, such as BER, read counts, etc. may be evaluated at that time to determine whether to proceed with the augmentation processing.

While the foregoing operation has been described in the context of MLCs, it will be appreciated that the same programming can be applied to SLCs. As discussed above, SLCs store only a single bit and generally use the logical 11 distribution 130 in FIG. 6 to represent a logical 1, and the logical 00 distribution 134 in FIG. 6 to represent a logical 0. Regardless of whether the cells are programmed as MLCs or SLCs (including MLCs that each store more than two bits each), the charge augmentation operation can be viewed as programming 0xFF (or its logical equivalent) to the lowest level page of data stored to a group of cells.

Figure 13:
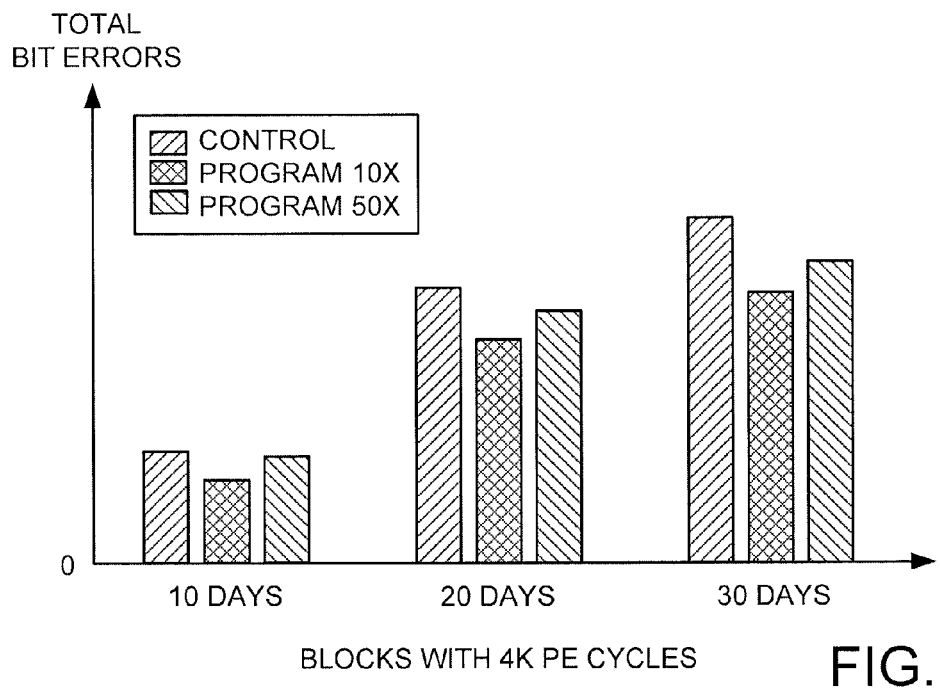
FIG. 13 is a graphical representation of exemplary test data obtained using the circuit of FIG. 10.

FIG. 13 graphically represents experimental data results obtained using processing as set forth above on a group of flash memory cells. The cells were provisioned with nominally 4K P/E cycles to place the cells in mid-to-late life condition. Test data were programmed to the cells representing the various programming states of FIG. 6 (11, 10, 00 and 01). Read operations were performed periodically over the test period.

The cells under evaluation were divided into three (3) groups. A first group was selected to be a control group to which no charge augmentation processing would be applied during the test period. A second group of the cells received 10 charge augmentation operations over every 10 days (10×). A third group of the cells received 50 charge augmentation operations over every 10 days (50×). Total bit errors were measured at the conclusion of 10 days, 20 days and 30 days of retention time, respectively.

As can be seen from FIG. 13, the second and third groups of cells benefited from the application of the charge augmentation operations, since these groups consistently demonstrated lower numbers of bit errors as compared to the control group. Moreover, the second group, which essentially received an average of one charge augmentation operation per day, exhibited better performance (lower number of bit errors) than the third group which essentially received an average of five charge augmentation operations per day. It is believed that the third control group may have had excessive charge supplied to the cells at a rate greater than the leakage rate from the cells, leading to a slight increase in overall BER.

Overall, the second group exhibited a reduction of bit errors on the order of about 20% over the control group. This represents a significant improvement and demonstrates the efficacy of the charge augmentation operation in retaining existing programming states.

Empirical data such as represented in FIG. 13 can be used to establish an appropriate charge augmentation scheduling scheme. Different schemes can be used for different portions of memory subjected to different operational loading levels. For example, read intensive areas may receive a greater frequency of charge augmentation processing as compared to write heavy areas.

In further cases, parameters such as resulting BERs or similar can be monitored and the rate of augmentation processing adaptively adjusted (including the application of more or less augmentation processing) to drive the BER or other measurements to a minimum level. The controller 102 or other internal device processing component can thus develop and implement an in-situ adaptive charge augmentation policy. Background scans during idle or low I/O periods can also be used to evaluate and apply the augmentation processing as required.

Finally, other types of compensation can be applied to the memory, such as refresh operations to read out the stored data and to write the data back to the memory in a new location. For example, data that have been subjected to a selected number of consecutive charge augmentation operations, such as 100 operations, may be scheduled for a more conventional data refresh operation based on data aging or other effects, which can be carried out using conventional garbage collection processing.

Figure 14:
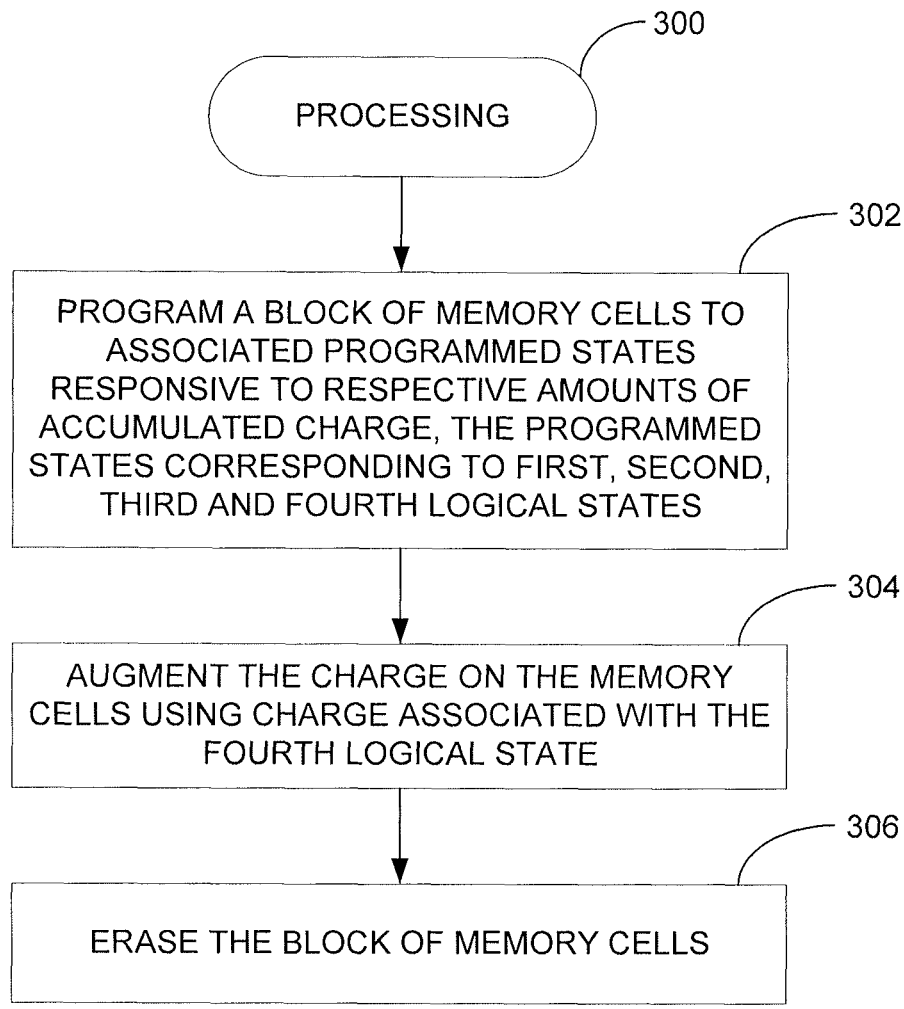
FIG. 14 is a flow chart for a processing routine illustrative of some embodiments of the present disclosure.

FIG. 14 is a processing routine 300 in accordance with some embodiments. At step 302, a block of memory cells is programmed to associated programmed states responsive to respective amounts of accumulated charge. The programmed states correspond to first, second, third and fourth logical states, such as illustrated in FIG. 6. The charge on the memory cells is augmented at step 304 using charge associated with the fourth logical state, such as discussed above in FIG. 12. The block of memory cells is subsequently erased at step 306.

It will now be appreciated that the various embodiments of the present disclosure can provide a number of benefits over the current art. Unlike conventional data refresh operations that require data to be read from the memory and rewritten back to the memory (either in the same location after an erasure or to a new location in the memory), the charge augmentation operation as embodied herein facilitates maintenance of the currently programmed states without the need to read out the data or perform one or more erasure or garbage collection operations.

To this point, it will be noted that other forms of memory that use refresh processing, such as dynamic random access memory (DRAM), operate to read the data out and rewrite the data back to various memory cells (usually many times per second). It will thus be appreciated that terms such as "solid state non-volatile memory cells" and the like, as used in the appended claims, expressly disclaim such operations that involve the reading out of the existing data and the writing of the data back to the memory, including but not limited to the context of a battery-backed up or similar "non-volatile" DRAM.

While flash memory cells have been used as a particular example, it will be appreciated that any number of non-volatile solid-state memory cells can benefit from the disclosed technique, including erasable memory cells such as flash that require a separate erasure operation to reset the cells to a baseline state (e.g., 11) prior to receiving new programmed data.

It is to be understood that even though numerous characteristics and advantages of various embodiments of the present disclosure have been set forth in the foregoing description, together with details of the structure and function of various thereof, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
   a block of solid-state non-volatile memory cells each programmed to an associated programmed state responsive to a respective amount of accumulated charge; and
   a charge loss compensation circuit adapted to add a relatively small amount of additional charge to the respective amount of accumulated charge in each of the memory cells to maintain the associated programmed states of the cells, the charge loss compensation circuit adding the relatively small amount of additional charge to a selected cell that was programmed to a first programmed state during a first programming operation by applying a subsequent, second programming operation configured to program the selected cell at a different, second programmed state representing a programmed state from among the associated programming states that has a smallest amount of accumulated charge on a floating gate of each of the memory cells, wherein an erasure operation is not applied to the selected cell between the first and second programming operations.

2. The apparatus of claim 1, wherein the first programmed state corresponds to a selected one of a first, second or third logical state, the second programmed state corresponds to a different, fourth logical state, and wherein the selected cell is subsequently erased through application of an erasure operation to place the cell in the fourth logical state.

3. The apparatus of claim 1, wherein the charge loss compensation circuit adds the relatively small amount of additional charge by, for each of the memory cells, directing an accumulation of a quanta of charge in a charge storage device and a transfer of the quanta of charge from the charge storage device to a floating gate of said each of the memory cells.

4. The apparatus of claim 1, wherein the charge loss compensation circuit determines a parametric state of the memory cells and adds the small amount of additional charge to the memory cells responsive to the parametric state.

5. The apparatus of claim 4, wherein the parametric state comprises a data retention time comprising an overall elapsed period of time during which a selected set of data has been retained in the memory cells, and wherein the charge loss compensation circuit adds the relatively small amount of additional charge responsive to the data retention time exceeding a predetermined threshold.

6. The apparatus of claim 1, wherein the charge loss compensation circuit directs the application of nominally the same amount of charge to different memory cells programmed to different logical states.

7. The apparatus of claim 1, wherein a selected one of the memory cells has a first total amount of accumulated charge responsive to a programming operation, wherein the first total amount of accumulated charge decays over time to provide a reduced, second total amount of accumulated charge, and wherein the relatively small amount of additional charge is added to the second total amount of accumulated charge to produce a third total amount of accumulated charge that is nominally equal to the first total amount of accumulated charge.

8. The apparatus of claim 1, wherein the charge loss compensation circuit further operates to apply a program verify operation to each of the memory cells after the addition of the relatively small amount of additional charge.

9. The apparatus of claim 1, wherein the charge loss compensation circuit further operates to direct a read verify operation to each of the memory cells by reading out the programmed states of the memory cells and applying an error correction code (ECC) thereto.

10. A data storage device comprising:
    an array of flash memory cells;
    a programming circuit adapted to program each of the flash memory cells to one of a plurality of available programming states responsive to a transfer of different corresponding amounts of charge to the flash memory cells, the charge accumulated on floating gates of the flash memory cells; and
    a charge loss compensation circuit adapted to, for a group of the flash memory cells respectively programmed to the plurality of available programming states, perform a charge augmentation operation by adding a relatively small amount of additional charge to the respective amount of accumulated charge in each of the flash memory cells in the group to maintain the associated programmed states of the flash memory cells in the group without performing a read operation to read the respective programmed states and without performing an intervening erasure operation to remove accumulated charge from the memory cells, the relatively small amount of additional charge added by the charge loss compensation circuit corresponding to a charge amount used by the programming circuit to program a selected cell to a first programmed state from among the plurality of available programming states, the first programmed state representing a programmed state from among the plurality of available programming states that accumulates a smallest amount of accumulated charge on a floating gate of each of the flash memory cells.

11. The data storage device of claim 10, wherein the first programmed state corresponds to an erased state, the plurality of available programming states further comprises a second programmed state having to a selected amount of accumulated charge greater than the erased state, and the charge loss compensation circuit programs at least one of the flash memory cells programmed to the second programmed state to the first programmed state without an intervening erase operation applied thereto.

12. The data storage device of claim 10, wherein the charge loss compensation circuit subsequently performs a read verify operation to confirm the respective programmed states of each of the flash memory cells in the group.

13. A method comprising:
    programming a block of solid-state non-volatile memory cells to respective programming states in relation to a total amount of accumulated charge in each of the memory cells; and performing a charge augmentation operation by adding a relatively small amount of additional charge to the respective amount of accumulated charge in each of the memory cells to maintain the associated programmed states of the cells, the performing step applying the relatively small amount of additional charge to program a selected cell previously programmed to a first programming state during the programming step to a different, second programming state with an erasure operation not applied to the selected cell between the programming and performing steps, the second programmed state representing a programmed state from among the associated programming states that has a smallest amount of accumulated charge on a floating gate of each of the memory cells.

14. The method of claim 13, wherein the charge augmentation operation comprises applying a programming operation to each of the memory cells corresponding to a selected one of the programming states.

15. The method of claim 13, wherein the charge augmentation operation comprises accumulating a quanta of charge in a charge storage device and transferring the quanta of charge from the charge storage device to a floating gate of said each of the memory cells.

16. The method of claim 13, further comprising determining a parametric state associated with a selected memory cell, and performing the charge augmentation operation upon the selected memory cell responsive to the determined parametric state.

17. The method of claim 16, wherein the parametric state comprises a total number of read operations that have taken place upon the block of memory cells having the respective programming states.

18. The method of claim 13, wherein the memory cells comprise flash memory cells.

* * * * *